United States Patent
Taguchi

[19]

[11] Patent Number: 5,808,334

[45] Date of Patent: Sep. 15, 1998

[54] SEMICONDUCTOR MEMORY DEVICE HAVING REDUCED PARASITIC CAPACITIES BETWEEN BIT LINES

[75] Inventor: Masao Taguchi, Sagamihara, Japan

[73] Assignee: Fujitsu Limited, Kawasaki, Japan

[21] Appl. No.: 340,318

[22] Filed: Nov. 14, 1994

Related U.S. Application Data

[63] Continuation of Ser. No. 65,048, May 24, 1993, abandoned, which is a continuation of Ser. No. 702,015, May 17, 1991, abandoned.

[30] Foreign Application Priority Data

May 17, 1990 [JP] Japan .................................. 2-127524

[51] Int. Cl.$^6$ ................................................. H01L 27/108
[52] U.S. Cl. ............................................. 257/296; 257/488
[58] Field of Search ........................ 357/53, 23.6, 23.6 G, 357/23.5; 257/296, 297, 488, 491

[56] References Cited

U.S. PATENT DOCUMENTS

| | | | |
|---|---|---|---|
| 3,811,076 | 5/1974 | Smith, Jr. ................................. | 357/53 |
| 4,780,852 | 10/1988 | Kajigaya et al. . | |
| 4,953,126 | 8/1990 | Ema ......................................... | 365/182 |
| 4,958,222 | 9/1990 | Takakura et al. .......................... | 357/53 |
| 5,057,887 | 10/1991 | Yashiro et al. ............................ | 357/53 |

FOREIGN PATENT DOCUMENTS

| | | |
|---|---|---|
| 0209069 B1 | 1/1987 | European Pat. Off. . |
| 2107544 | 10/1982 | United Kingdom . |

OTHER PUBLICATIONS

Garnache, R. "Insulated Gate FET Memory Chip . . . " IBM Tech. Disc. Bull. vol. 17, No. 1 Jun, 1974, p. 17.

*Primary Examiner*—Sara W. Crane
*Attorney, Agent, or Firm*—Staas & Halsey

[57] ABSTRACT

In a semiconductor memory device having a memory cell array and sense amplifiers connected by bit lines, a conductive shield plate is arranged over the bit lines and between the memory cell array and the sense amplifiers.

21 Claims, 17 Drawing Sheets

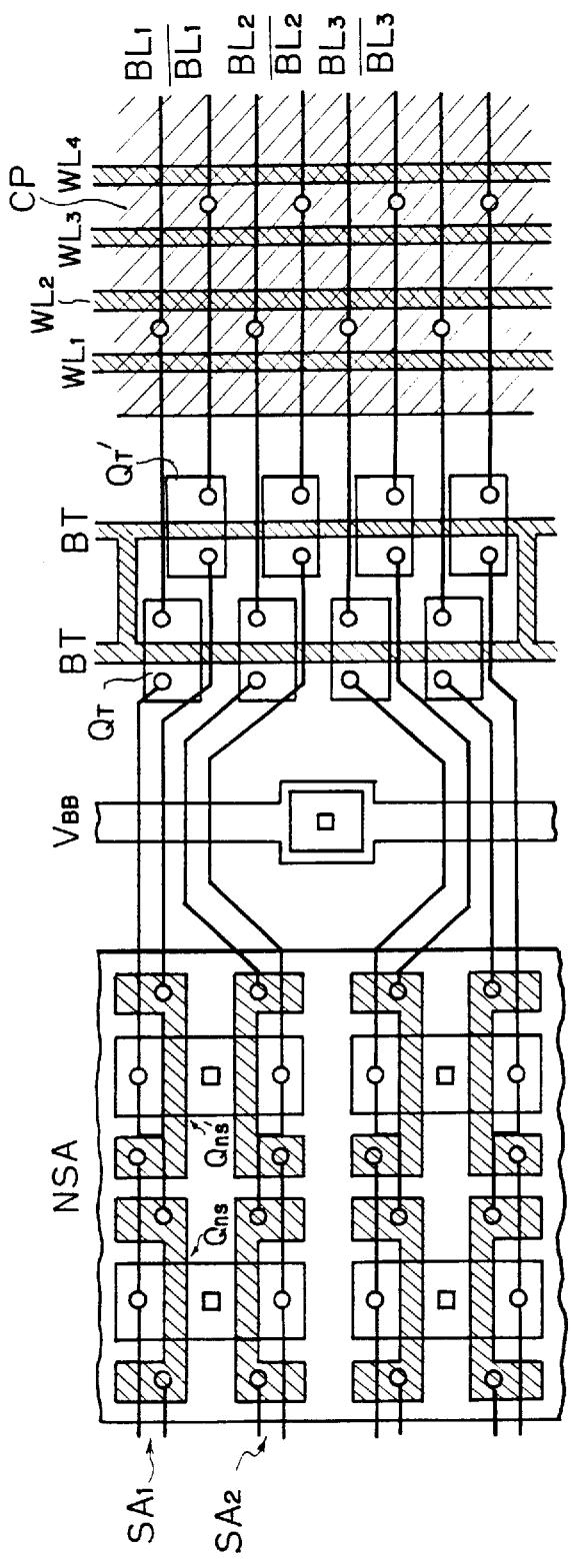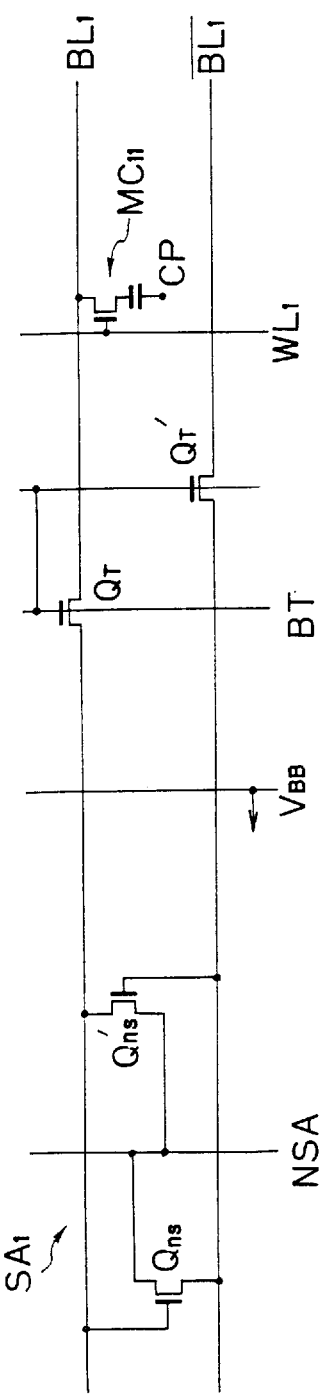
Fig. 2A PRIOR ART
Fig. 2B PRIOR ART

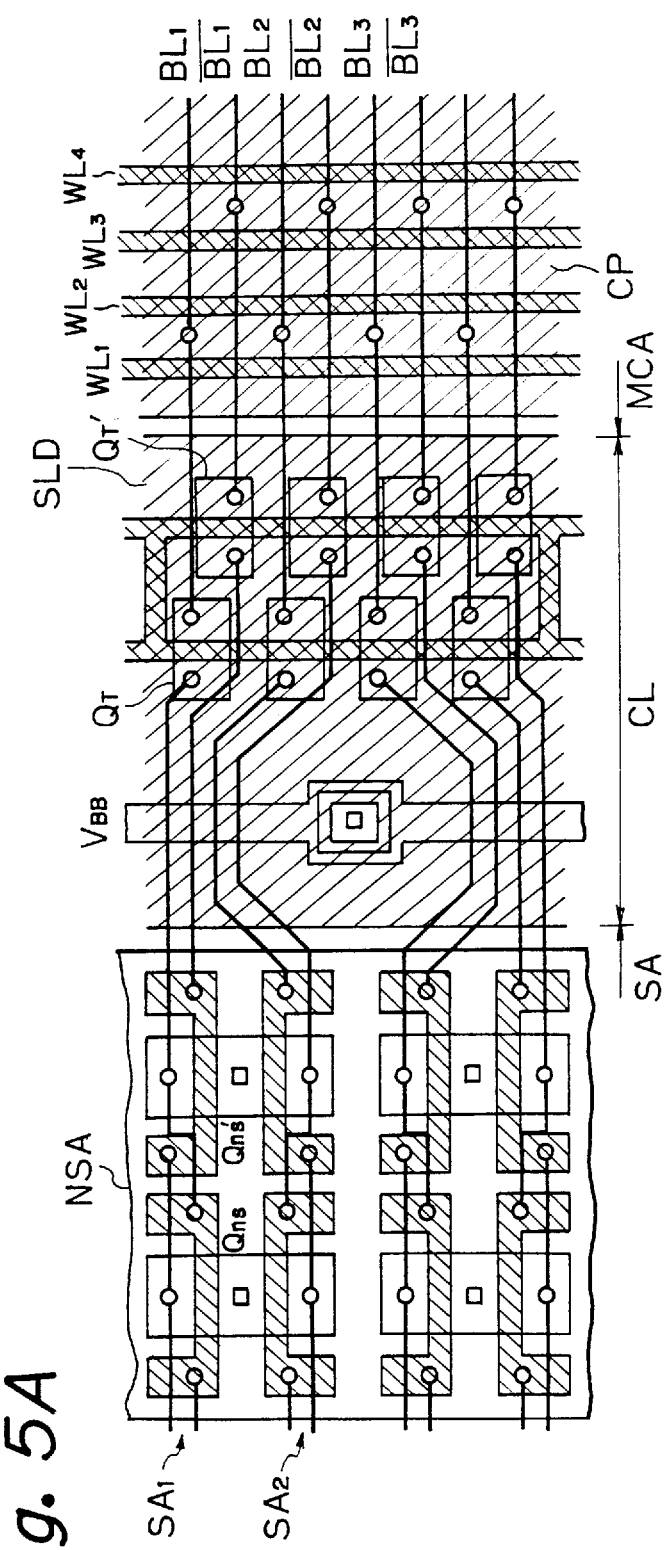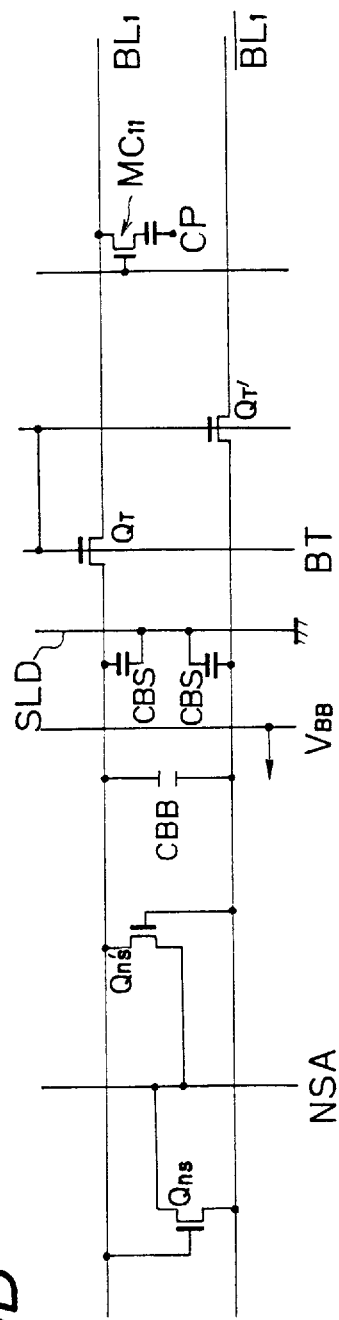
Fig. 5A
Fig. 5B

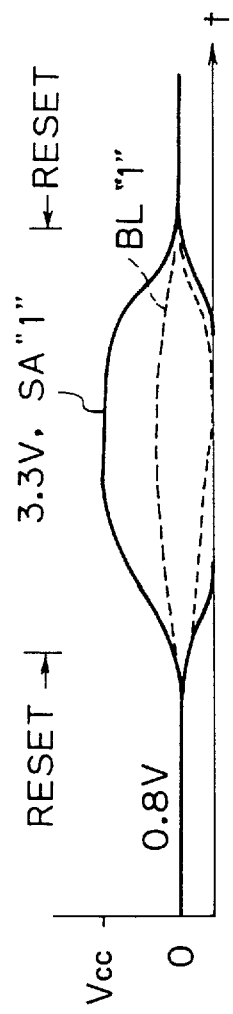

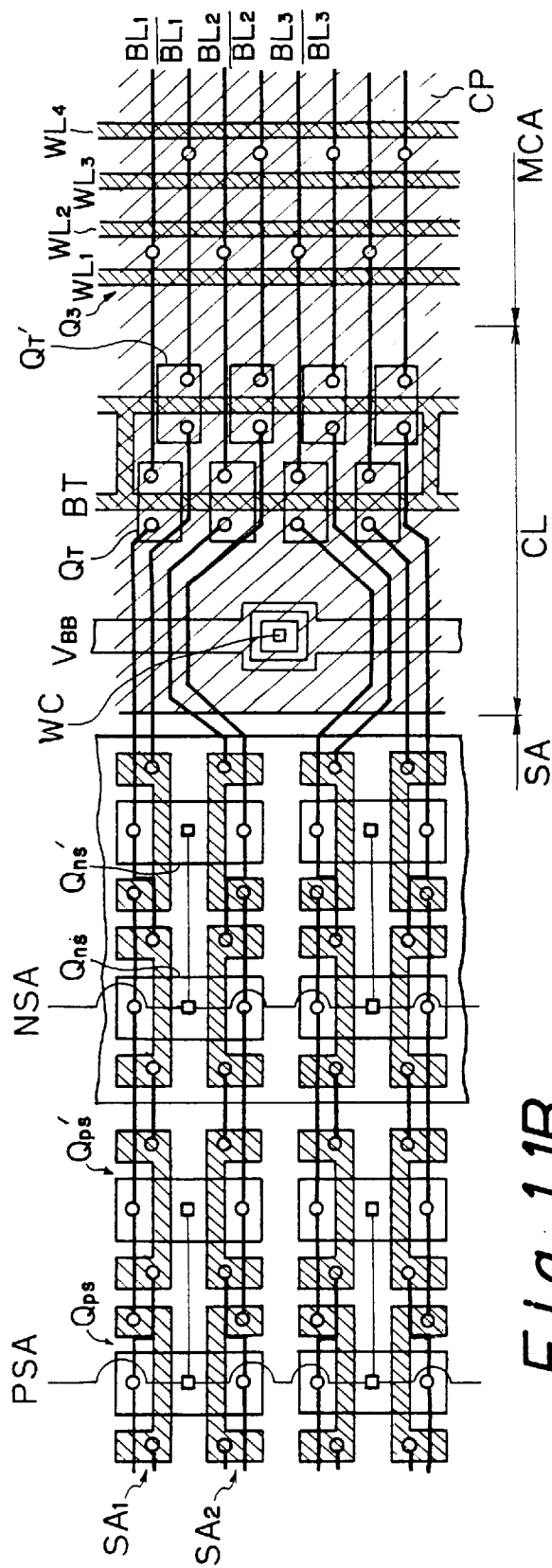
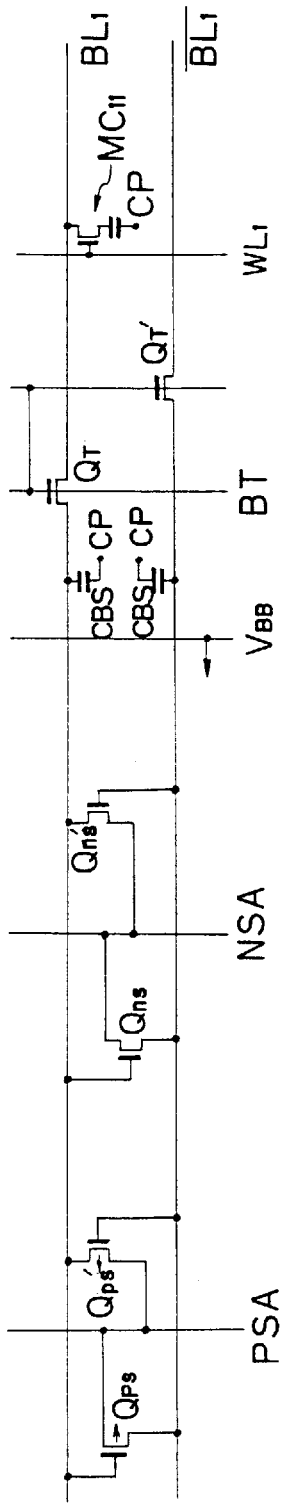
Fig. 11A
Fig. 11B

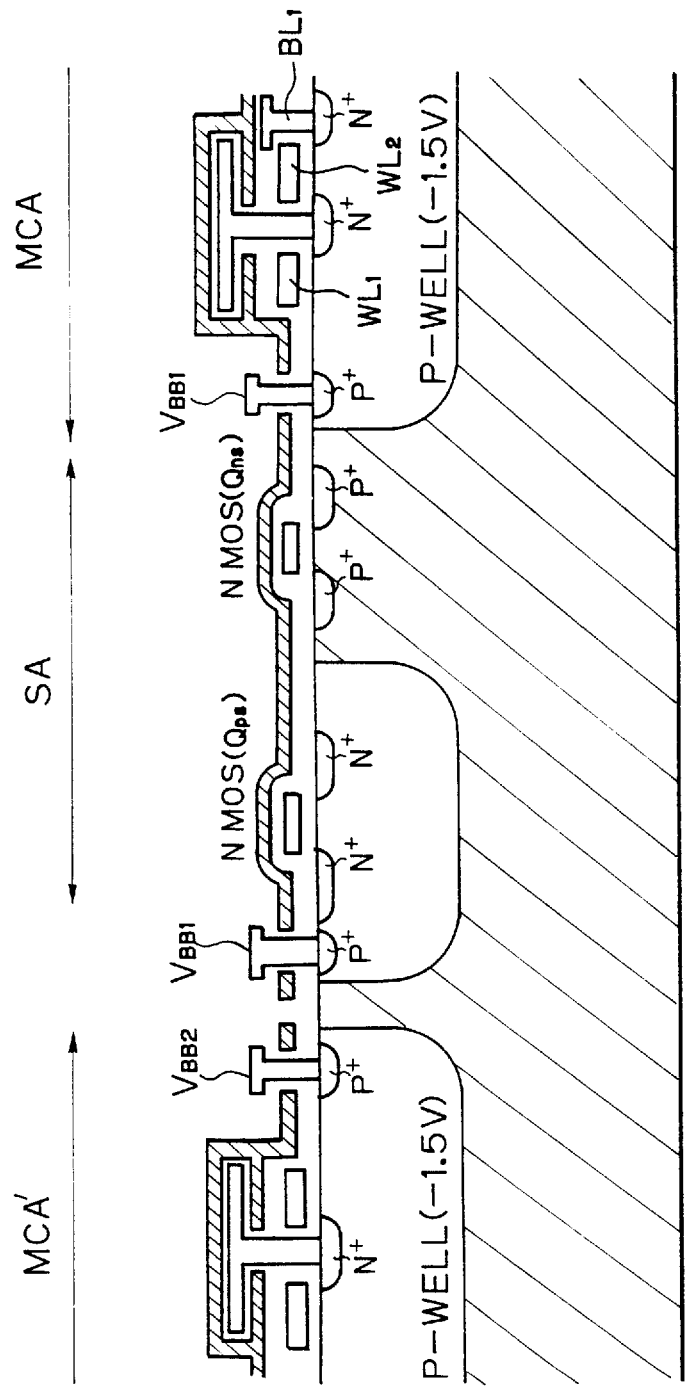

SEMICONDUCTOR MEMORY DEVICE HAVING REDUCED PARASITIC CAPACITIES BETWEEN BIT LINES

This application is a continuation of application Ser. No. 08/065,048, filed Mar. 24, 1993, now abandoned which is a continuation of application Ser. No. 07/702,015, filed May 17, 1991, now abandoned.

BACKGROUND OF THE INVENTION

1) Field of the Invention

The present invention relates to a semiconductor memory device, and more particularly, to a dynamic MOS (metal-oxide-semiconductor, broadly MIS) random access memory (RAM) having a highly-integrated configuration.

2) Description of the Related Art

Recently, the integration and density of DRAMs has become greater, and this has given rise to serious problems with regard to the conductor—spacing capacitance between internal connections, particularly, the parasitic electrostatic capacitance between bit lines. For example, a small difference in potential between two folded bit lines is sensed by a sense amplifier, but a signal on one bit line affects other adjacent bit lines as noise, due to the parasitic electrostatic capacitance therebetween, and this leads to an erroneous operation of the sense amplifier. To avoid such an erroneous operation, the following measures have been suggested.

1) A twisted connection method is applied to a pair of folded bit lines to cancel noise due to the parasitic electrostatic capacitance therebetween. This is based upon a concept of a twisted pair connection method in telephone lines. In this method, however, due to the complexity of the connections of the bit lines inside of and near the sense amplifiers, it is substantially impossible to apply the above-mentioned twisted connection method to these connections.

2) A configuration and a material are selected that will reduce the parasitic electrostatic capacitance between the bit lines. For example, a metal such as polycrystalline silicon and tungsten having a high melting point is used for the bit lines, instead of aluminum. Usually, aluminium is deposited by a sputtering process, and therefore, a layer of aluminium cannot be made too thin as this will lead to many disconnections. Conversely, a high melting point metal can be deposited by a vapor phase growth method such as a chemical vapor deposition (CVD) method, and therefore, a layer of such a metal can be made thin to thus reduce the parasitic electrostatic capacitance between the bit lines. Even in this method, when the integration and density of DRAMs is made greater to thereby significantly increase the number of bit lines, there is a limit to the thickness of the bit lines, since the resistance thereof is thereby significantly increased by reduction of the thickness of the bit line.

3) A stacked capacitor-type cell configuration is adopted (see FIG. 3A) to increase the effective capacitance of a cell capacitor, thus obtaining a relatively large difference in potential between the bit lines. Accordingly, such a stacked capacitor cell configuration is not subject to noise due to the parasitic electrostatic capacitance between the bit lines. Nevertheless, even in this stacked capacitor-type cell configuration, when the integration and density of DRAMs are made greater, there is a limit to the increase of the capacitance of the cell capacitor.

Also, a special stacked capacitor-type cell configuration can be adopted (see FIG. 3B). That is, bit lines are first formed on a cell transistor portion, and then a capacitor electrode portion (cell plate electrode) is formed over the bit lines, so that a capacitor is created on the bit lines. In this configuration, the cell plate electrode serves as a conductive shield plate for the bit lines, to thereby reduce the parasitic electrostatic capacitance between the bit lines. This stacked capacitor cell configuration, however, has not been applied to the bit lines inside of and near the sense amplifiers.

4) The number of sense amplifiers is reduced. That is, in a folded bit line type device, a pair of bit lines, which are complementary to each other, are connected to one sense amplifier, but in this method, two pairs of such bit lines are connected to one sense amplifier. As a result, the pitch of connections within the sense amplifiers is broadened, to thus reduce the parasitic electrostatic capacitance between the bit lines. In this case, however, the sense amplifiers are connected to both sides of a memory cell array.

Also, a shared sense amplifier configuration can be adopted. In this shared sense amplifier configuration, two pairs of such bit lines are connected to both sides of one sense amplifier, to reduce the number of sense amplifiers. In this configuration, however, the pitch of connections such as bit lines within the sense amplifiers is still small. Further, transfer gates are usually provided on the bit lines between the sense amplifiers and the memory cells, thus complicating an area between the sense amplifiers and the memory cells. Therefore, it is impossible to reduce the parasitic electrostatic capacitance between the bit lines, since the bit lines inside of and near the sense amplifiers have a relatively large parasitic electrostatic capacitance.

SUMMARY OF THE INVENTION

An object of the present invention is to further reduce the parasitic electrostatic capacitance between the bit lines in DRAMs.

According to the present invention, in a semiconductor memory device having a memory cell array and sense amplifiers connected by bit lines, a conductive shield plate is arranged over the bit lines between the memory cell array and the sense amplifiers whereby the parasitic electrostatic capacitance between the bit lines is reduced.

BRIEF DESCRIPTION OF THE DRAWINGS

The present invention will be more clearly understood from the description as set forth below, with reference to the accompanying drawings, wherein:

FIG. 2A is a layout diagram illustrating a prior art shared sense amplifier type DRAM device;

FIG. 2B is an equivalent circuit diagram of the DRAM device of FIG. 2A;

FIG. 5A is a layout diagram illustrating a second embodiment of the DRAM device according to the present invention;

FIG. 5B is an equivalent circuit diagram of the DRAM device of FIG. 5A;

FIG. 5C is a timing diagram showing the operation of the device of FIG. 5A;

FIG. 11A is a modification of FIG. 4A;

FIG. 11B is a modification of FIG. 4B;

FIG. 13B is a modification of FIG. 12B.

DESCRIPTION OF THE PREFERRED EMBODIMENTS

Before the description of the embodiments of the present invention, a prior art DRAM device will be explained below.

Figure 1:
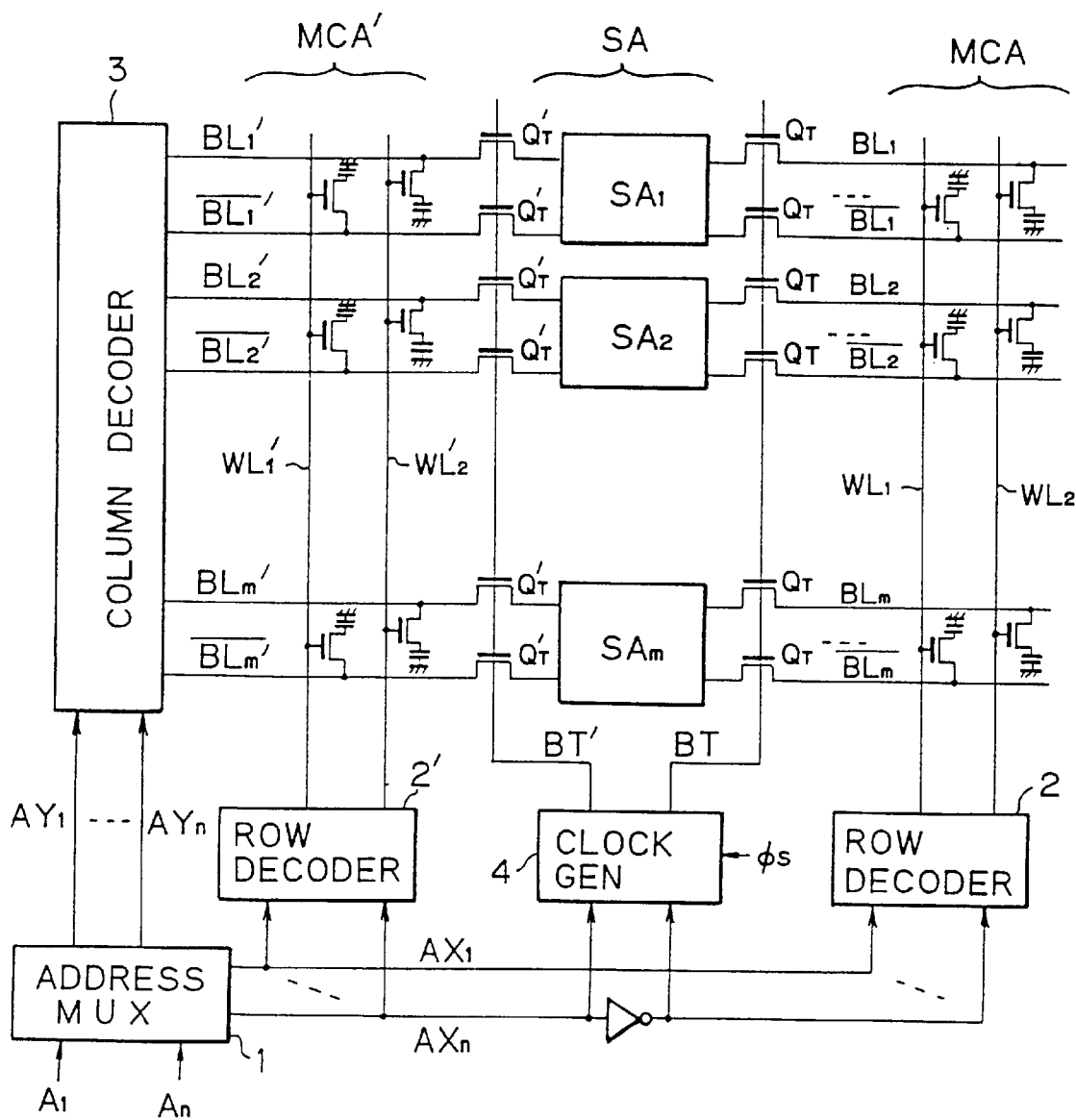
FIG. 1 is a circuit diagram illustrating a general shared sense amplifier type DRAM.

FIG. 1 illustrates a prior art DRAM device, which is a shared sense amplifier type device having two memory cell arrays MCA and MCA' which are arranged on both sides of sense amplifiers $SA_1$, $SA_2$, ..., and $SA_m$. The prior art DRAM device also has two pairs of folded bit lines such as $BL_1$ and $\overline{BL_1}$, and $BL_1'$ and $\overline{BL_1'}$ which are connected to one of the sense amplifiers such as $SA_1$. Reference numeral 1 designates an address multiplexer for receiving address signals $A_1$ through $A_n$ from the address buffer (not shown) to generate multiple X-address signals $AX_1$ through $AX_n$ and Y-address signals $AY_1$ through $AY_n$. Reference numerals 2 and 2' designate row decoders for selecting one of the word lines $WL_1$, $WL_2$, ... (or $WL_1'$, $WL_2'$, ...) of the memory cell arrays MCA and MCA' in accordance with the X-address signals $AX_1$ through $AX_n$. Reference numeral 3 designates a column decoder for selecting one pair of the bit lines such $BL_1$ and $\overline{BL_1}$ ($BL_1'$ and $\overline{BL_1'}$) of the memory cell arrays MCA and MCA' in accordance with the Y-address signals $AY_1$ through $AY_n$. Reference numeral 4 designates a clock generator for generating a clock signal BT or BT' in accordance with the X-address signal $AX_n$ and the clock signal $\phi_S$ from the RAS clock system (not shown).

Also, transfer gates $Q_T$ and $Q_T'$ are provided on the bit lines $BL_1$, $\overline{BL_1}$, ..., $BL_1'$, $\overline{BL_1'}$, ... between the sense amplifiers $SA_1$, $SA_2$, ..., $SA_m$ and the memory cell arrays MCA and MCA'. Further, one-transistor, one-capacitor type memory cells such as $MC_{11}$ are provided mosaicly at intersections between the word lines and the bit lines.

In FIG. 2A, which is a layout diagram of a prior art shared sense amplifier type DRAM device and in FIG. 2B, which is a partial equivalent circuit diagram of the device of FIG. 2A, each of the sense amplifiers $SA_1$, $SA_2$, ... is formed by two cross-coupled N-channel MOS transistors $Q_{ns}$ and $Q_{ns}'$, which are enabled by a low potential of a clock signal NSA. In this case, each of the sense amplifiers also has two cross-coupled P-channel MOS transistors $Q_{ps}$ and $Q_{ps}'$, which are enabled by a high potential of a clock signal PSA, (not shown in FIGS. 2A and 2B, but shown in FIGS. 11A and 11B). Also, the memory cell array MCA has a cell plate CP common to all memory cells. This cell plate CP serves as a conductive shield plate for reducing the parasitic electrostatic capacitance between the bit lines such as $BL_1$ and $\overline{BL_1}$, as shown in FIGS. 3A and 3B, which illustrate one memory cell.

Figure 3A:
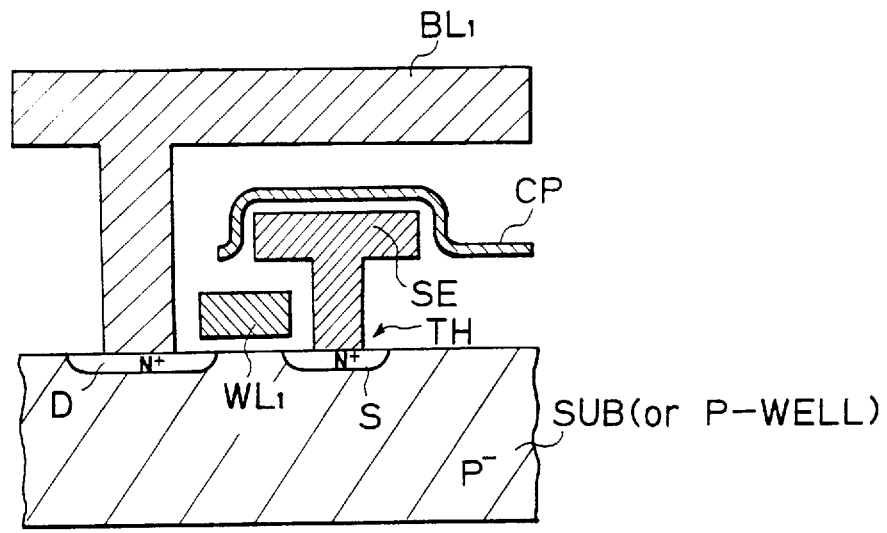
FIG. 3A is a cross-sectional view of a memory cell of FIG. 2A.

In FIG. 3A, impurities such as phosphorus or arsenic are doped into a $P^-$-type monocrystalline silicon substrate SUB to obtain a source region S and a drain region D, thus forming a cell transistor. Also, a word line $WL_1$, which serves as a gate electrode, is formed by depositing polycrystalline silicon with a CVD method via the gate insulator (not shown) on the substrate SUB. Further, a storage electrode SE is formed by depositing polycrystalline silicon by a CVD method via a through hole TH on the source region S, and a common cell plate CP is formed opposite to the storage electrode SE, with an insulating layer (not shown) therebetween, thus forming a cell capacitor. In FIG. 3A, a bit line such as $BL_1$ is formed on the cell plate CP. Therefore, in this case, the cell plate CP cannot properly serve as a conductive shield layer for the bit lines, since the cell plate CP covers only a part of the lower surface of the bit lines.

Figure 3B:
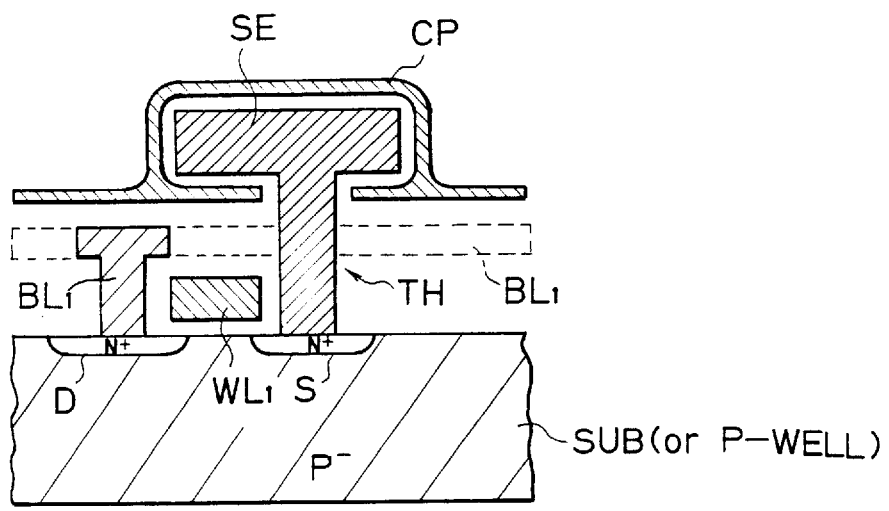
FIG. 3B is another cross-sectional view of a memory cell of FIG. 2A.

Conversely, in FIG. 3B, after a cell transistor is formed, a common cell plate CP is formed thereon, so that the common cell plate CP completely covers the memory cell array MCA, particularly, the bit lines within the memory cell array MCA. Also, since the cell plate CP covers both sides of the bit lines as well as the upper surface thereof, the shield effect of the cell plate CP against the bit lines is remarkably increased compared with that of the cell plate CP of FIG. 3A. This contributes to the reduction of the parasitic electrostatic capacitance between the bit lines.

Note that, if the device of FIG. 2A is manufactured by a CMOS technology, the memory cell array MCA, the transfer gates $Q_T$ and $Q_T'$, and one part sense amplifiers $SA_1$, $SA_2$, ... enabled by the clock signal NSA are formed on a P-well, and therefore, a bias voltage $V_{BB}$ is applied thereto. Also, in this case, the substrates SUB of FIGS. 3A and 3B are formed by the P-well.

In the device of FIG. 2A using the memory cells of FIG. 3B, however, since a portion indicated by CL is not covered by the cell plate CP, the reduction of the parasitic electrostatic capacitance CBB between the bit lines is still insufficient.

Figure 4A:
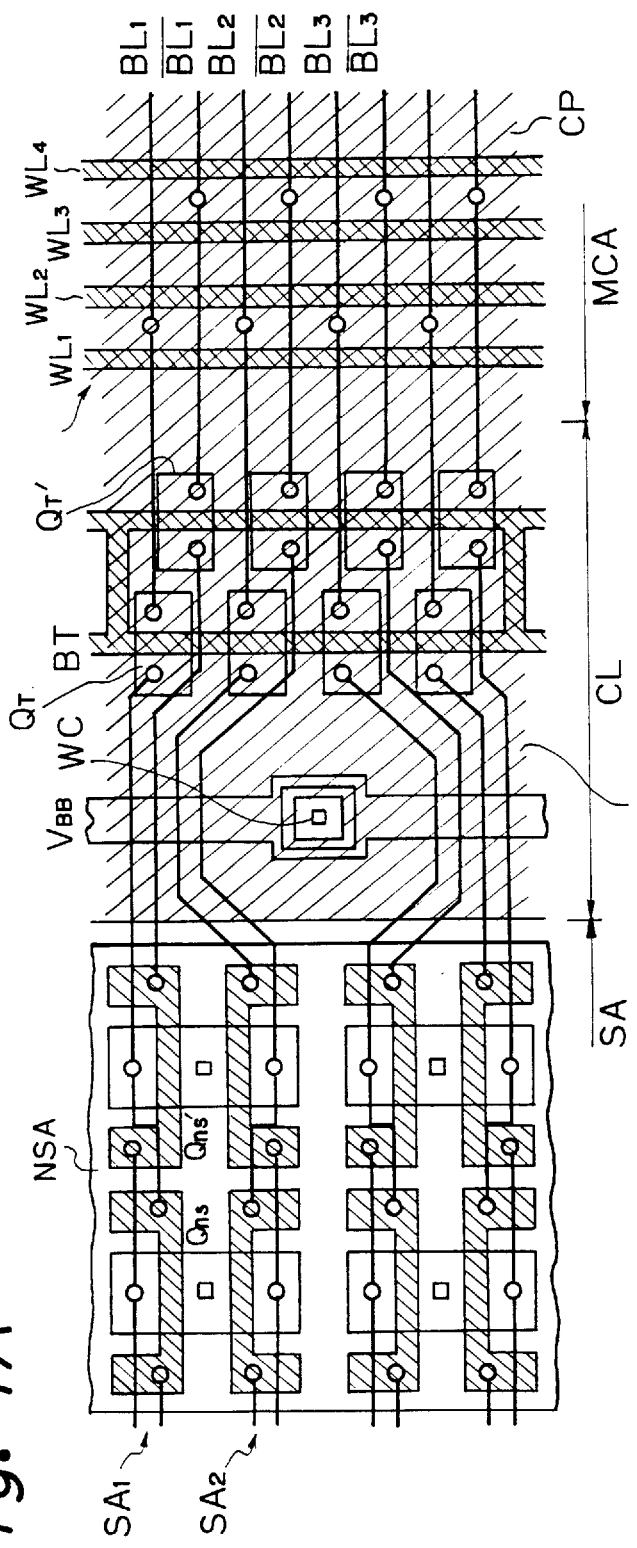
FIG. 4A is a layout diagram illustrating a first embodiment of the DRAM device according to the present invention.
Figure 4B:
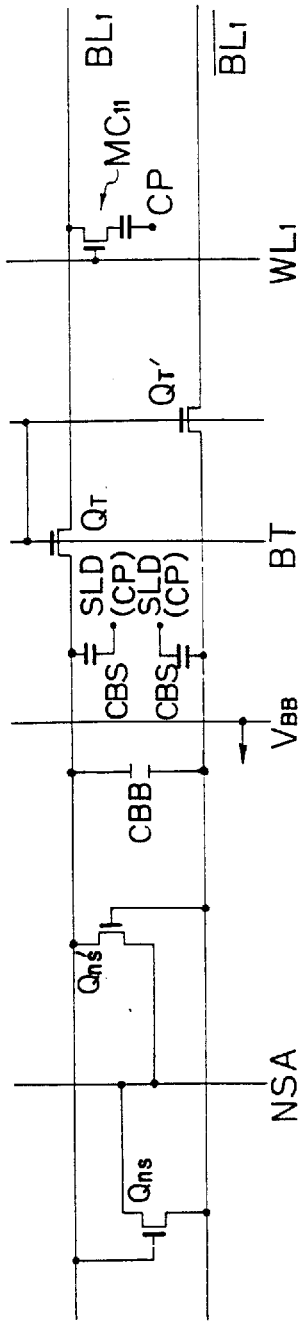
FIG. 4B is an equivalent circuit diagram of the DRAM device of FIG. 4A.
Figure 4C:
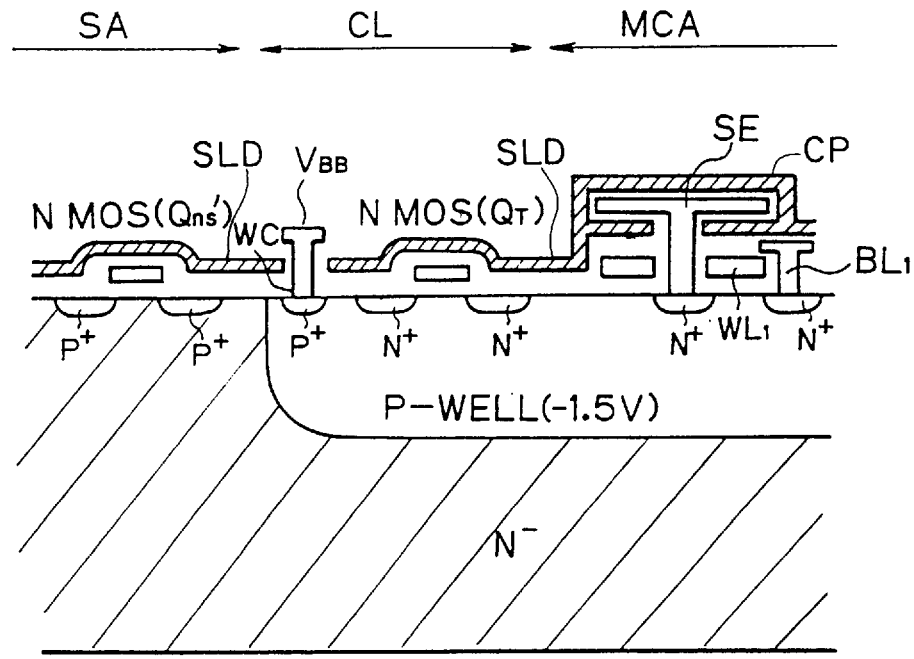
FIGS. 4C and 4D are cross-sectional views of the device of FIG. 4A.

In FIG. 4A, which is a layout diagram illustrating a first embodiment of the present invention, and in FIG. 4B, which is an equivalent circuit diagram of FIG. 4A, a conductive shield plate SLD is added to the device of FIGS. 2A and 2B. This conductive shield plate SLD covers the portion CL in which the transfer gates $Q_T$ and the bias voltage line for $V_{BB}$ are formed. In this case, the cell plate CP of FIG. 3B is used, as illustrated in FIG. 4C. Therefore, the conductive shield plate SLD is integrated with the cell plate CP of the memory cell array MCA, i.e., the conductive shield plate SLD and the cell plate CP are made of the same metal layer such as polycrystalline, and therefore, the addition of the conductive shield plate SLD is carried out without increasing the number of manufacturing steps.

Figure 4D:
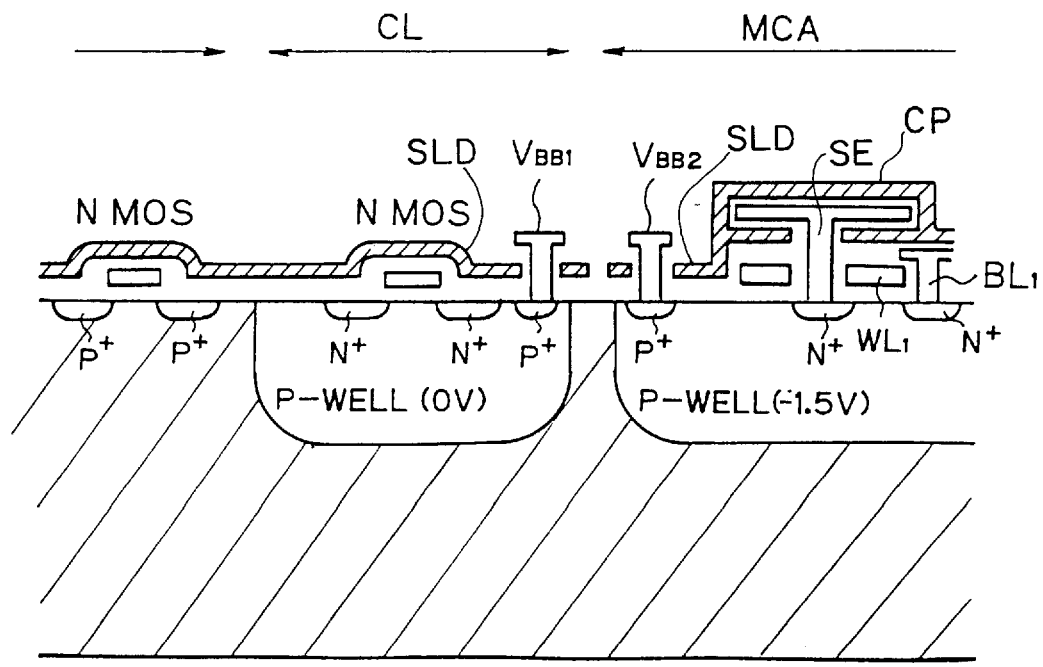

As illustrated in FIG. 4C, a well bias voltage line $V_{BB}$, which is made of aluminium, is deposited via a well contact WC to the P-well region. The voltage of the well bias voltage line $V_{BB}$ is, for example, −1.5 V. In practice, however, as illustrated in FIG. 4D, two separate well bias voltage lines $V_{BB1}$ and $V_{BB2}$, having voltages 0 V and −1.5 V respectively, are connected to the P-well region for the transfer gates $Q_T$ and the P-well region for the memory cell array MCA. That is, the higher threshold voltage $V_{BB1}$ (=0V) reduces the threshold voltage of the transistors of the sense amplifiers SA to enhance the operation speed thereof, while the lower threshold voltage $V_{BB2}$ (=−1.5V) increases the threshold voltage of the transistors of the memory cell array MCA to reduce the leakage current therefrom.

In FIGS. 4C and 4D, the width of each bit line is about 1 $\mu$m, and the thickness thereof is about 0.5 $\mu$m. Also, the spacing between the bit lines is about 1.5 $\mu$m.

According to the device of FIGS. 4A through 4D, the parasitic electrostatic capacitance CBS between the conductive shield plate SLD, including the cell plate CP, and each bit line is increased to thus reduce the parasitic electrostatic capacitance CBB between the bit lines. As a result, a potential at one bit line generated during a read operation has little effect on potentials at other adjacent bit lines. Namely, each bit line is able to withstand the effects of noise generated at bit lines adjacent thereto, and thus an erroneous write operation due to a read operation can be avoided.

Note that the above-mentioned parasitic electrostatic capacitance CBS of the bit lines due to the conductive shield plate SLD (and CP) cannot lead to the above-mentioned erroneous operation, since noise generated by the parasitic electrostatic capacitance CBS of each bit line is compensated at the conductive shield plate SLD and the cell plate CP.

In FIGS. 5A and 5B, which illustrate a second embodiment of the present invention, the conductive shield plate SLD is separate from the cell plate CP and is connected to a power supply source such as the ground. Nevertheless, the conductive shield plate SLD and the cell plate CP are made of the same material as used in the first embodiment of FIGS. 4A through 4D.

The separation of the conductive shield plate SLD and the cell plate CP is particularly effective when the amplitude of the restore voltage at the bit lines is different from the amplitude of the sense voltage of the sense amplifiers. For example, as shown in FIG. 5C, assuming that a reset voltage for the bit lines is 0.8 V, and a restore voltage, i.e., a rewritten voltage of "1", is 1.6 V, and further, that a reset voltage for the sense amplifiers is assumed to be 0.8 V. In this case, to enhance the drive power of the data buses (not shown) selectively connected to one pair of bit lines, the drive of the sense amplifiers is carried out by using an external power supply voltage such as 3.3 V, and thus the sense voltage is amplified, i.e., increased to 3.3 V. To suppress the transfer of such a high voltage of 3.3 V to bit lines having a "1" level of only 1.6 V, the gate voltage BT of the transfer gates $Q_T$ is restricted to 1.6 V. Therefore, the mean voltage of the bit lines within the sense amplifiers is increased from 0.8 V (reset mode) to 1.65 V (=3.3/2) (sense operation mode), and as a result, the conductive shield plate SLD receives this increase of voltage due to the parasitic electrostatic capacitance CBS as a noise voltage. If the cell plate CP is connected to the conductive shield plate SLD, this noise voltage is transmitted as a bump noise to the cell plate CP, and thus leads to a change of the charges stored in the memory cells. The device of FIGS. 5A and 5B stops the effect of such a bump noise on the memory cells.

Figure 6:
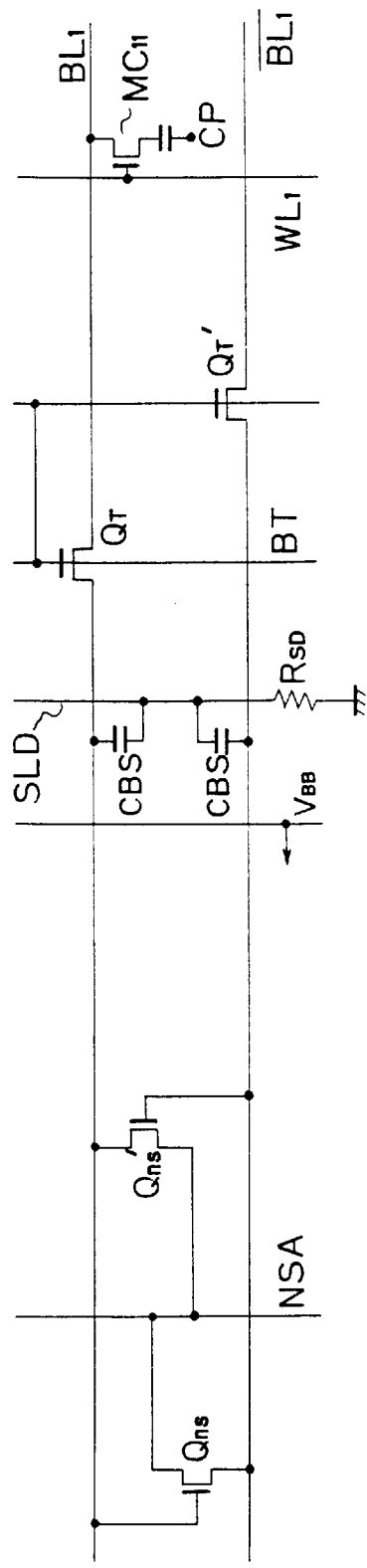
FIG. 6 is an equivalent circuit diagram illustrating a third embodiment of the DRAM device according to the present invention.

In FIG. 6, which is a third embodiment of the present invention, a resistor $R_{SD}$ is inserted between the conductive shield plate SLD and the ground in FIG. 5A and 5B. If the resistor $R_{SD}$ is not included, as in the device of FIGS. 5A and 5B, when the sense amplifier is operated so that a noise supplied to the conductive shield plate SLD is supplied directly to the power supply such as the ground, such a noise also is transferred in other circuits, via the power supply. To avoid this, the resistor R is provided to smooth the noise with a time constant $\tau$ determined by CBS×$R_{SD}$×n, where n is the number of bit lines. If this time constant is too large, however, a shield effect of the conductive shield plate SLD is reduced. Note that this shield effect is used to release a noise applied thereto to the power supply without releasing the noise to other adjacent bit lines. Therefore, the above-mentioned time constant $\tau$ must be smaller than a value which corresponds, for example, to a half of a cycle time of a row address strobe (RAS) signal.

Note that the resistor $R_{SD}$ can be introduced into the conductive shield plate SLD, if the conductive shield plate SLD is made of high resistance polycrystalline silicon.

Figure 7:
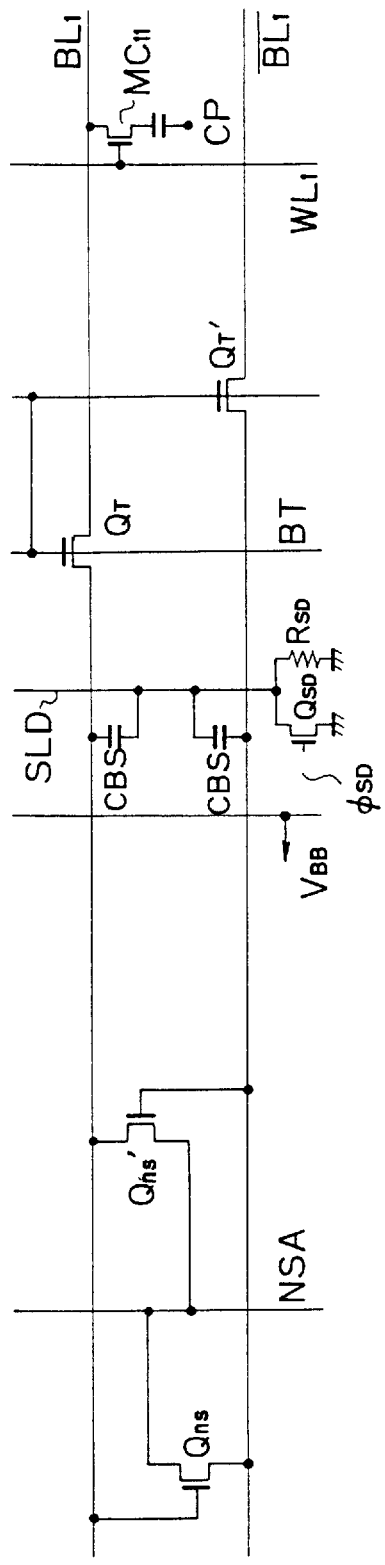
FIG. 7 is a layout diagram illustrating a fourth embodiment of the DRAM device according to the present invention.

In FIG. 7, which is a fourth embodiment of the present invention, an N-channel MOS transistor $Q_{SD}$ is added to the device of FIG. 6, and the transistor $Q_{SD}$ is controlled by a clock signal $\phi_{SD}$, which is turned OFF after the activation of the sense amplifiers but before a completion of the operation of the sense amplifiers.

The clock signal $\phi_{SD}$ is explained with reference to FIGS. 8A through 8C.

Figure 8A:
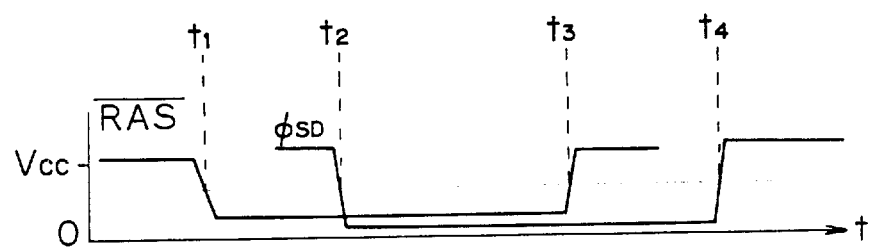
FIGS. 8A, 8B, and 8C are timing diagrams showing the signals of FIG. 7.
Figure 8B:
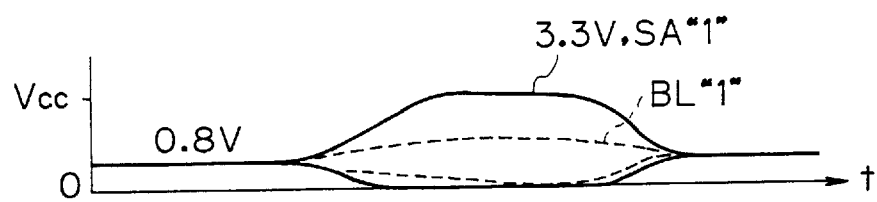
Figure 8C:

As shown in FIG. 8A, for a time period (several nanoseconds) ($t_1$–$t_2$) after the $\overline{RAS}$ signal is received, the clock signal $\phi_{SD}$ remains high and the transistor $Q_{SD}$ is turned ON, i.e., the conductive shield plate SLD is grounded to thereby exhibit a shielding effect. At a time $t_2$, the state of the sense amplifiers is determined, the conductive shield plate SLD is no longer present, and the clock signal $\phi_{SD}$ falls to turn OFF the transistor $Q_{SD}$. As a result, the conductive shield plate SLD becomes substantially in a floating state, due to the OFF state of the transistor $Q_{SD}$, and therefore, when the mean voltage of the bit lines near the sense amplifiers is increased from 0.8 V to 1.65 V, the voltage of the conductive shield plate SLD follows this mean voltage, as shown in FIGS. 8B and 8C. At a time $t_3$, when the signal $\overline{RAS}$ rises to complete a RAS cycle as shown in FIG. 8A, the sense voltages of the sense amplifiers are reset to 0.8 V as shown in FIG. 8B, and accordingly, the voltage of the conductive shield plate SLD falls as shown in FIG. 8C. Finally, at a time $t_4$, the clock signal $\phi_{SD}$ returns to the initial stage.

Figure 8D:
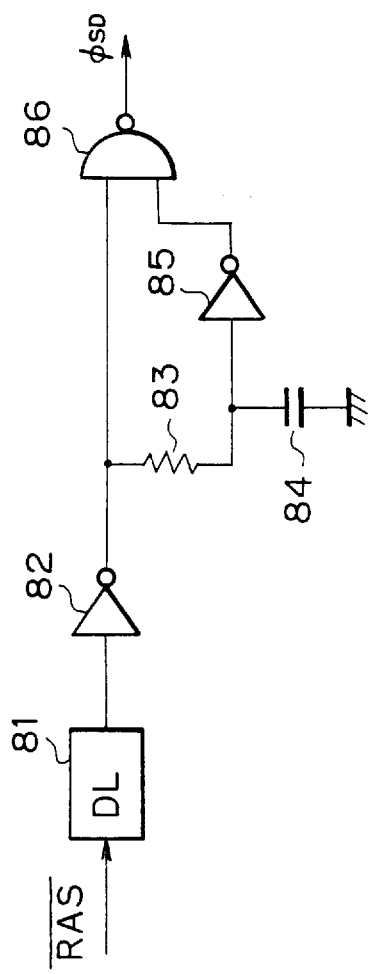
FIG. 8D is a circuit diagram of a circuit for generating the signal $\phi_{SD}$ of FIG. 7.

Note that the clock signal $\phi_{SD}$ can be easily obtained by using a circuit as illustrated in FIG. 8D. In FIG. 8D, 81 designates a delay circuit, 82 designates an invester, 83 designates a resistor, 84 designates a capacitor, 85 designates an invester, and 86 designates a NAND circuit.

Thus, according to the device of FIG. 7, the change of the voltage of the conductive shield plate SLD due to the change of the mean voltage of the bit lines near the sense amplifiers is not led to the power supply (the ground), and thus the power consumption is reduced.

Note, in FIG. 7, the resistor $R_{SD}$ can be omitted, i.e., the above-mentioned time constant $\tau$ has a lower limit equal to a half of a RAS cycle, but has no upper limit, and therefore, the value of the resistor $R_{SD}$ can be made infinite, i.e., the resistor $R_{SD}$ can be omitted.

Figure 9:
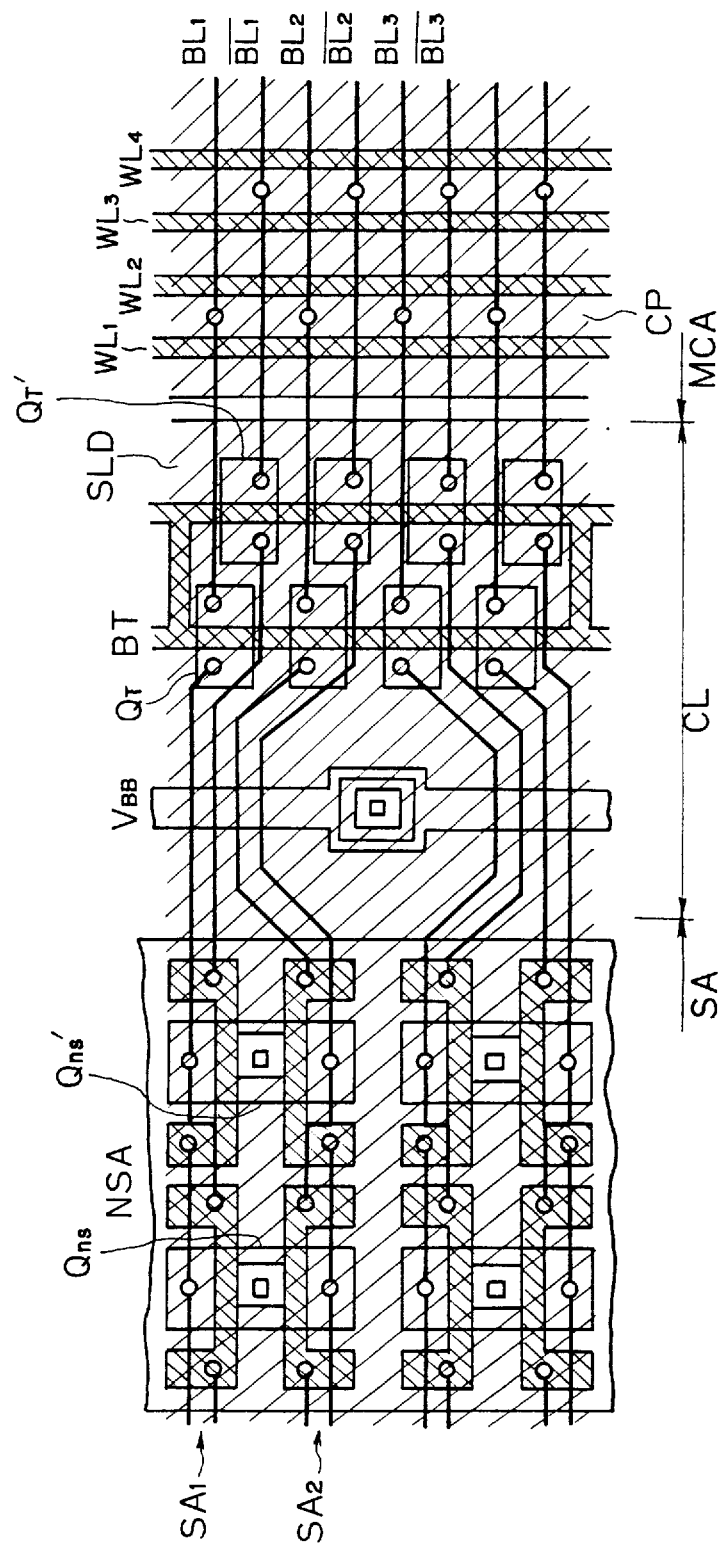
FIG. 9 is a layout diagram illustrating a fifth embodiment of the DRAM device according to the present invention.
Figure 10:
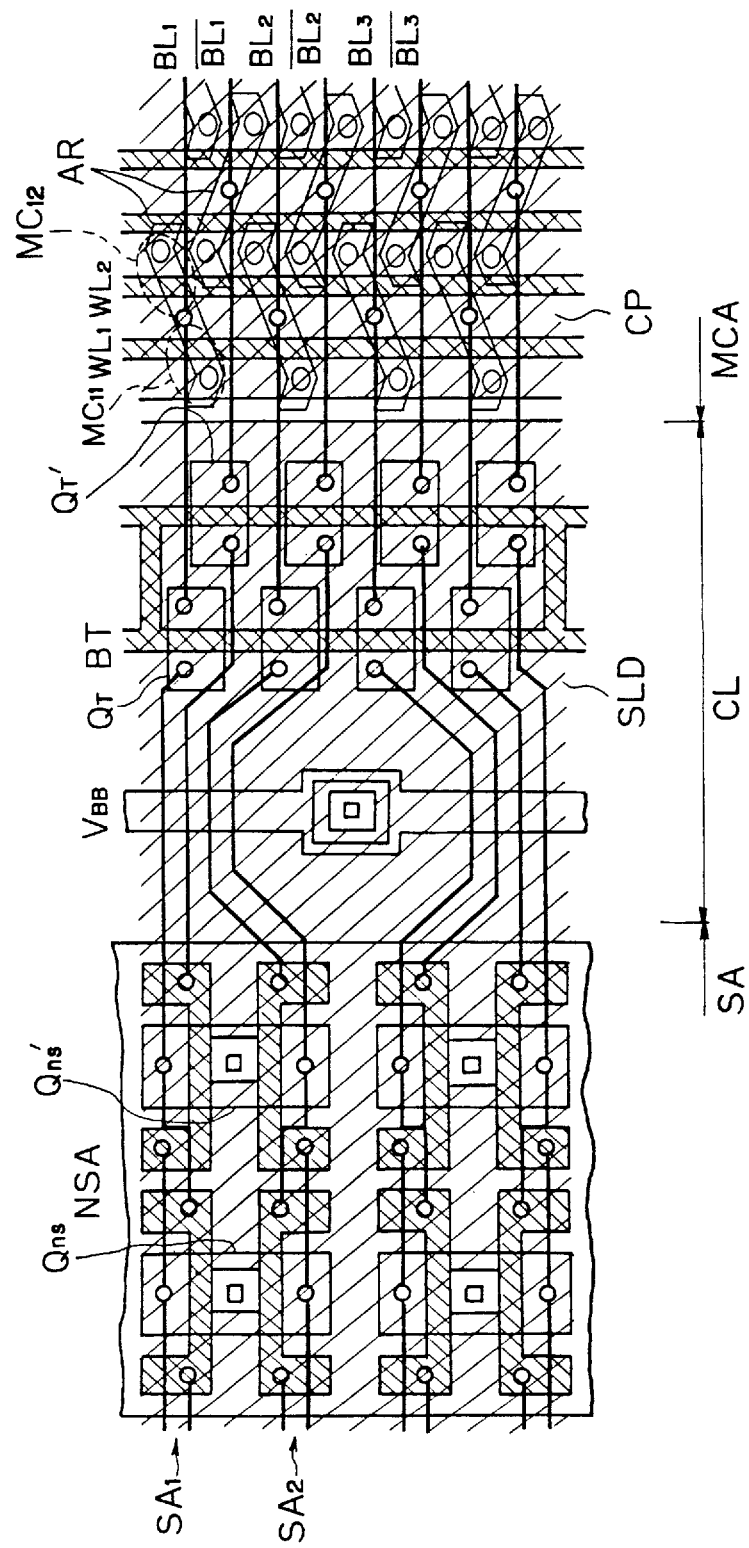
FIG. 10 is a detailed layout diagram of the DRAM device of FIG. 9.

In FIGS. 9 and 10, which show a fifth embodiment of the present invention, the conductive shield plate SLD also covers the sense amplifier portion SA, to further exhibit a shield effect for noise generated between the bit lines.

Particularly, in FIG. 10, active areas for the source and drain regions of the cell transistors are indicated by AR.

In FIGS. 11A and 11B, which are modifications of FIGS. 4A and 4B, P-channel MOS transistors $Q_{ps}$ and $Q_{ps}'$ are added to each of the sense amplifiers $SA_1$, $SA_2'$ .... Also, in FIG. 12A, which is a modification of FIG. 5A, P-channel MOS transistors $Q_{ps}$ and $Q_{ps}'$ are added to each of the sense amplifiers $SA_1$, $SA_2$, .... The P-channel transistors $Q_{ps}$ and $Q_{ps}'$ are enabled by a low potential of a clock signal PSA. FIG. 12B is a cross-sectional view of FIG. 12A, the P-channel transistor of the sense amplifier portion SA, the transfer gate portion CL', and the memory cell array MCA' are also illustrated in addition to FIG. 4D.

Figure 12A:
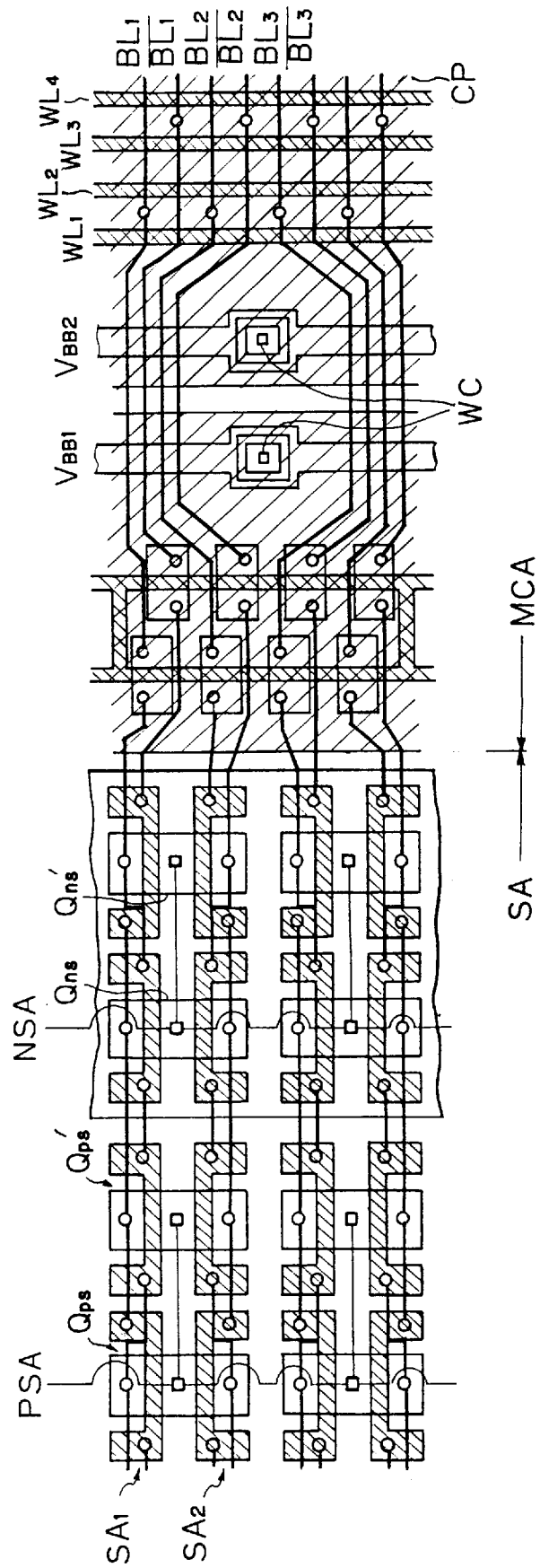
FIG. 12A is a diagram illustrating a modification of FIG. 5A.
Figure 12B:
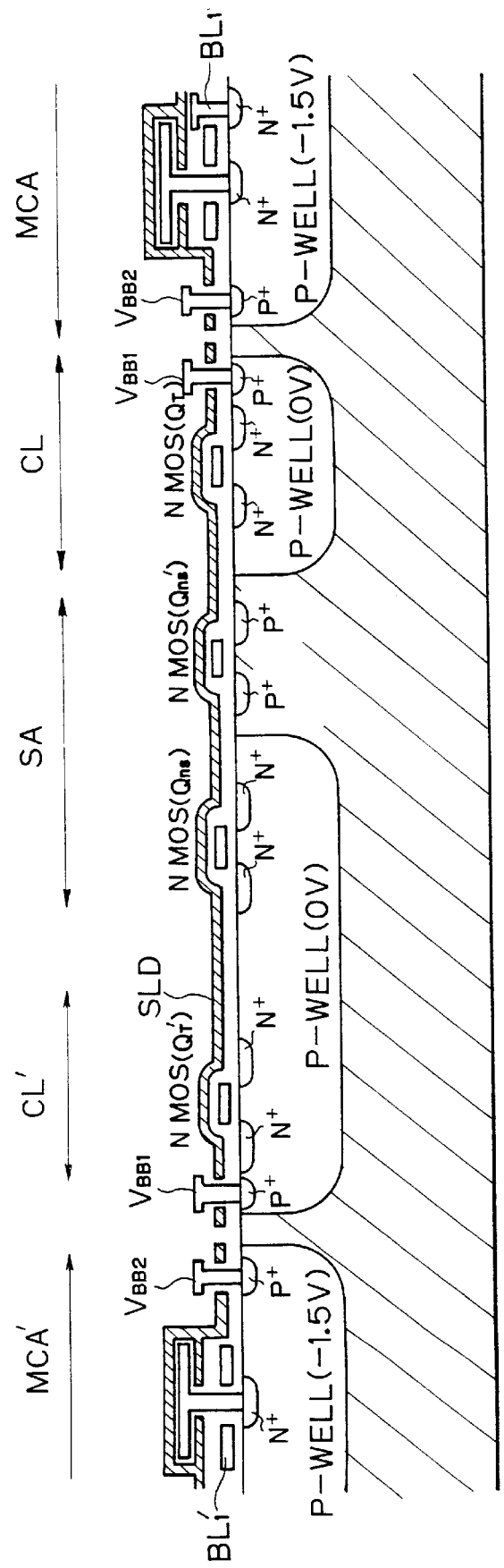
FIG. 12B is a cross-sectional view of the device of FIG. 12A.
Figure 13A:
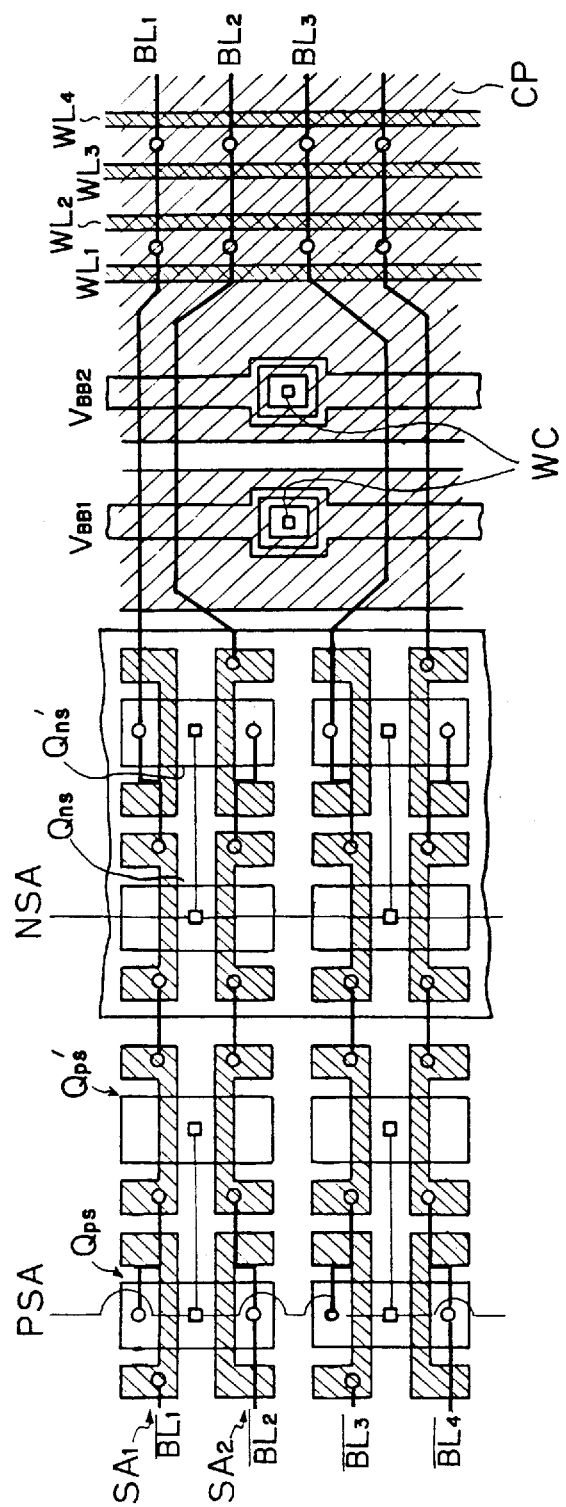
FIG. 13A is a modification of FIG. 12A.

Further, in FIGS. 13A and 13B, which are modifications of FIGS. 12A and 12B, an open bit line type device is illustrated. In this device, the transfer gates $Q_T$ and $Q_T'$ are unnecessary. Note, the present invention obviously can be applied to a simple folded bit line type DRAMs.

As explained above, according to the present invention, since the parasitic electrostatic capacity between the bit lines can be reduced by the conductive shield plate, an erroneous operation due to noise between the bit lines can be avoided. Also, since the provision of the conductive shield plate does not increase the occupied area of the device, the integration thereof is not reduced.

I claim:

1. A semiconductor memory device, comprising:

a semiconductor substrate having a major surface;

a plurality of memory cells arranged in a first portion of the main surface of the semiconductor substrate, each of the memory cells comprising a transistor and an associated capacitor having first and second electrodes, the first electrode of the capacitor being connected to the associated transistor;

a plurality of word lines connected to said plurality of memory cells;

a plurality of pairs of bit lines connected to said plurality of memory cells, respectively, and extending in a common direction along the main surface of the semiconductor substrate beyond said first portion thereof, the bit lines of each pair being disposed in adjacent relationship and each memory cell being connected between a respective said bit line and a respective said word line;

a first insulating layer interposed between said bit lines and the major surface of said semiconductor substrate;

a second insulating layer formed over said bit lines;

said second electrodes of said associated capacitors of said plurality of memory cells comprising corresponding portions of a common cell plate of a conductive material formed on said second insulating layer and spaced thereby from said first electrodes of said associated capacitors of said plurality of memory cells;

a plurality of sense amplifiers arranged in a second portion of said main surface of said semiconductor substrate, separated from the first portion thereof by a third portion of said major surface of said semiconductor substrate, and connected to said plurality of pairs of bit lines for sensing potentials on said bit lines, said bit lines extending over the third portion and to the second portion for connection to the plurality of sense amplifiers; and a conductive shield plate, of the same conductive material as said common cell plate, formed over said plurality of pairs of bit lines and arranged in the third portion of said major surface of said semiconductor substrate, between the first and second portions thereof and thereby spaced, and electrically separated, from said common cell plate, for suppressing signal interference between said bit lines of each said pair.

2. A device as set forth in claim 1, wherein each of said memory cells comprises a stacked capacitor type memory cell in which said common cell plate is arranged over said bit lines with an insulating layer therebetween.

3. A device as set forth in claim 1, wherein said conductive shield plate is arranged over said sense amplifiers with an insulating layer therebetween.

4. A device as set forth in claim 1, wherein said conductive shield plate is connected to a power supply.

5. A device as set forth in claim 4, wherein said conductive shield plate is connected directly to said power supply.

6. A device as set forth in claim 4, further comprising:

a resistor coupled between said conductive shield plate and said power supply.

7. A device as set forth in claim 4, wherein said power supply is ground.

8. A device as set forth in claim 6, further comprising:

a switch, connected in parallel with said resistor, said switch being turned OFF after activation of said sense amplifiers before a completion of a sense operation by said sense amplifiers, and said switch being turned ON after resetting said sense amplifiers.

9. A device as set forth in claim 6, further comprising:

a switch, connected between said conductive shield plate and said power supply, said switch being turned OFF after activation of said sense operation by said sense amplifiers, and said switch being turned ON after resetting said sense amplifiers.

10. A device as set forth in claim 1, wherein said bit lines are a shared type in which folded bit lines are arranged on both sides of said sense amplifiers, further comprising:

transfer gates interposed at said bit lines between said sense amplifiers and said memory cells, said conductive shield plate being arranged over said transfer gates.

11. A device as set forth in claim 1, wherein said bit lines are a folded type in which said bit lines are arranged on one side of said sense amplifiers.

12. A device as set forth in claim 1, wherein said bit lines are an open type in which said bit lines are arranged on both sides of said sense amplifiers.

13. A semiconductor memory device formed on a semiconductor substrate, comprising:

a memory cell array for storing data and including a plurality of memory cells, a plurality of pairs of bit lines connected to said plurality of memory cells, respectively, and extending in a common direction along the semiconductor substrate, the bit lines of each pair being disposed in adjacent relationship, and a plurality of word lines connected to said plurality of memory cells, each memory cell being connected between a respective said bit line and a respective said word line, each of the memory cells comprising a transistor and an associated capacitor having first and second electrodes, the first electrode of the capacitor being connected to the associated transistor and said second electrodes of said associated capacitors of said plurality of memory cells comprising corresponding portions of a common cell plate of a conductive material;

a sense amplifier coupled to said memory cell array and sensing potentials of the data on the plurality of bit lines;

a conductive shield plate arranged over said plurality of pairs of bit lines, and extending therewith along the semiconductor substrate, suppressing signal interference between the bit lines of each pair thereof, the conductive shield plate being spaced, and electrically separated, from the common cell plate;

a first insulating layer interposed between said plurality of pairs of bit lines and said semiconductor substrate; and a second insulating layer interposed between said plurality of pairs of bit lines and said conductive shield plate.

14. An apparatus suppressing signal interference between pairs of bit lines of a plurality of pairs of bit lines in a dynamic random access memory device of plural memory cells formed on a semiconductor substrate, each of the memory cells comprising a transistor and an associated capacitor having first and second electrodes, the first electrode of the capacitor being connected to the associated transistor and said second electrodes of said associated capacitors of said plurality of memory cells comprising corresponding portions of a common cell plate of a conductive material, the bit lines of each pair being disposed in adjacent relationship and the plurality of pairs of bit lines extending in a common direction on the semiconductor substrate, the apparatus comprising:

a conductive shield plate arranged over the plurality of pairs of bit lines and extending therewith along the semiconductor substrate so that a first distance, defined as a maximum of each of the distances between each of the plurality of bit lines and said conductive shield plate, is less than a second distance, defined as a minimum of each of the distances between the bit lines of each pair, of the plurality of pairs of bit lines, the conductive shield plate being spaced, and electrically separated, from the common cell plate.

15. A semiconductor memory device formed on a semiconductor substrate and coupled to a power supply, comprising:

a plurality of pairs of bit lines, the bit lines of each pair being disposed in adjacent relationship and the plurality of pairs of bit lines extending in a common direction along a surface of a semiconductor substrate;

a plurality of word lines;

a memory cell array including a plurality of memory cells, each memory cell connected between a respective said bit line and a respective said word line;

a plurality of sense amplifiers, connected to said plurality of pairs of bit lines, sensing potentials at said bit lines;

a conductive shield plate, disposed over said plurality of pairs of bit lines and extending therewith along the surface of said semiconductor substrate, and between said memory cell array and said sense amplifiers and connected to said power supply, the conductive shield plate suppressing signal interference between said bit lines of each said pair;

a resistor coupled between said conductive shield plate and said power supply; and a switch, connected in parallel with said resistor, said switch being turned OFF after activation of said sense amplifiers before a completion of a sense operation by said sense amplifiers, and said switch being turned ON after resetting said sense amplifiers.

16. A semiconductor memory device formed on a semiconductor substrate and coupled to a power supply, comprising:

a plurality of pairs of bit lines, the bit lines of each pair being disposed in adjacent relationship and the plurality of pairs of bit lines extending in a common direction along a surface of a semiconductor substrate;

a plurality of word lines;

a memory cell array including a plurality of memory cells, each memory cell connected between a respective said bit line and a respective said word line;

a plurality of sense amplifiers, connected to said plurality of pairs of bit lines, for sensing potentials at said bit lines;

a conductive shield plate, disposed over said plurality of pairs of bit lines and extending therewith along the surface of the semiconductor substrate, and between said memory cell array and said sense amplifiers and connected to said power supply, the conductive shield plate suppressing signal interference between said bit lines of each said pair;

a resistor coupled between said conductive shield plate and said power supply; and a switch, connected between said conductive shield plate and said power supply, said switch being turned OFF after activation of said sense operation by said sense amplifiers, and said switch being turned ON after resetting said sense amplifiers.

17. A semiconductor memory device comprising:

a semiconductor substrate having a main surface;

a first insulating layer formed on said main surface of said semiconductor substrate;

a plurality of memory cells arranged in a memory cell area of said semiconductor substrate, each of said memory cells comprising a transistor and a capacitor having a first electrode connected to said transistor and a second electrode;

a plurality of word lines connected to said memory cells;

a plurality of pairs of bit lines connected respectively to said plurality of memory cells and extending to outside of said memory cell area, the plurality of pairs of bit lines extending in a common direction along the main surface of the semiconductor substrate and the bit lines of each pair being disposed in adjacent relationship;

a second insulating layer formed over said plurality of pairs of bit lines;

a plurality of sense amplifiers arranged outside of said memory cell area and connected to said plurality of pairs of bit lines; and a conductive shield layer formed over said plurality of pairs of bit lines and extending therewith along the main surface of the semiconductor substrate in an area between said memory cell area and said sense amplifiers;

said second electrodes of said capacitors comprising corresponding portions of a common conductive layer formed over said second insulating layer; and said conductive shield layer comprising a conductive layer disposed in substantially a common level, relative to the main surface of the substrate, as said common conductive layer but spaced, and electrically separated, from said common conductive layer and suppressing signal interference between said bit lines of each said pair.

18. A semiconductor memory device as set forth in claim 17, wherein said first and second electrodes of said capacitor are formed over said second insulating layer.

19. A semiconductor memory device as set forth in claim 17, wherein said conductive shield layer is arranged over said plurality of sense amplifiers.

20. A semiconductor memory device, comprising:

a semiconductor substrate having a major surface;

a plurality of memory cells arranged in a first portion of the main surface of the semiconductor substrate, each of the memory cells comprising a transistor and an associated capacitor having first and second electrodes, the first electrode of the capacitor being connected to the associated transistor;

a plurality of word lines connected to said plurality of memory cells;

a plurality of pairs of bit lines connected to said plurality of memory cells, respectively, and extending in a common direction along the main surface of the semiconductor substrate beyond said first portion thereof, the bit lines of each pair being disposed in adjacent relationship and each memory cell being connected between a respective said bit line and a respective said word line;

a first insulating layer interposed between said bit lines and the major surface of said semiconductor substrate;

a second insulating layer formed over said bit lines;

said second electrodes of said associated capacitors of said plurality of memory cells comprising corresponding portions of a common cell plate of a conductive material formed on said second insulating layer and spaced thereby from said first electrodes of said associated capacitors of said plurality of memory cells;

a plurality of sense amplifiers arranged in a second portion of said main surface of said semiconductor substrate, separated from the first portion thereof by a third portion of said major surface of said semiconductor substrate, and connected to said plurality of pairs of bit lines for sensing potentials on said bit lines, said bit lines extending over the third portion and to the second portion for connection to the plurality of sense amplifiers;

a conductive shield plate, of the same conductive material as said common cell plate, formed over said plurality of pairs of bit lines and arranged in the third portion of said major surface of said semiconductor substrate, between the first and second portions thereof, said conductive shield plate being connected to a power supply and suppressing signal interference between said bit lines of each said pair;

a resistor coupled between said conductive shield plate and said power supply; and a switch, connected in parallel with said resistor, said switch being turned OFF after activation of said sense amplifiers before a completion of a sense operation by said sense amplifiers, and said switch being turned ON after resetting said sense amplifiers.

21. A semiconductor memory device, comprising:

a semiconductor substrate having a major surface;

a plurality of memory cells arranged in a first portion of the main surface of the semiconductor substrate, each of the memory cells comprising a transistor and an associated capacitor having first and second electrodes, the first electrode of the capacitor being connected to the associated transistor;

a plurality of word lines connected to said plurality of memory cells;

a plurality of pairs of bit lines connected to said plurality of memory cells, respectively, and extending in a common direction along the main surface of the semiconductor substrate beyond said first portion thereof, the bit lines of each pair being disposed in adjacent relationship and each memory cell being connected between a respective said bit line and a respective said word line;

a first insulating layer interposed between said bit lines and the major surface of said semiconductor substrate;

a second insulating layer formed over said bit lines;

said second electrodes of said associated capacitors of said plurality of memory cells comprising corresponding portions of a common cell plate of a conductive material formed on said second insulating layer and spaced thereby from said first electrodes of said associated capacitors of said plurality of memory cells;

a plurality of sense amplifiers arranged in a second portion of said main surface of said semiconductor substrate, separated from the first portion thereof by a third portion of said major surface of said semiconductor substrate, and connected to said plurality of pairs of bit lines for sensing potentials on said bit lines, said bit lines extending over the third portion and to the second portion for connection to the plurality of sense amplifiers;

a conductive shield plate, of the same conductive material as said common cell plate, formed over said plurality of pairs of bit lines and arranged in the third portion of said major surface of said semiconductor substrate, between the first and second portions thereof, said conductive shield plate being connected to a power supply and suppressing signal interference between said bit lines of each said pair;

a resistor coupled between said conductive shield plate and said power supply; and a switch, connected between said conductive shield plate and said power supply, said switch being turned OFF after activation of said sense operation by said sense amplifiers, and said switch being turned ON after resetting said sense amplifiers.

* * * * *